United States Patent
Lee et al.

(10) Patent No.: US 8,372,689 B2
(45) Date of Patent: Feb. 12, 2013

(54) WAFER-LEVEL SEMICONDUCTOR DEVICE PACKAGES WITH THREE-DIMENSIONAL FAN-OUT AND MANUFACTURING METHODS THEREOF

(75) Inventors: Ming-Chiang Lee, Kaohsiung (TW); Chien-Hao Wang, Hukou Township, Hsinchu County (TW)

(73) Assignee: Advanced Semiconductor Engineering, Inc., Kaohsiung (TW)

(*) Notice: Subject to any disclaimer, the term of this patent is extended or adjusted under 35 U.S.C. 154(b) by 300 days.

(21) Appl. No.: 12/691,660

(22) Filed: Jan. 21, 2010

(65) Prior Publication Data

US 2011/0177654 A1  Jul. 21, 2011

(51) Int. Cl.
*H01L 21/00* (2006.01)
(52) U.S. Cl. ......... 438/107; 257/E21.503; 257/E21.705; 438/110; 438/113; 438/114
(58) Field of Classification Search .................. 438/107, 438/127, 110, 113, 114; 257/E21.503, E21.705
See application file for complete search history.

(56) References Cited

U.S. PATENT DOCUMENTS

| | | | |
|---|---|---|---|
| 3,959,874 A | 6/1976 | Coucoulas | |
| 4,783,695 A | 11/1988 | Eichelberger et al. | |
| 5,019,535 A | 5/1991 | Wojnarowski et al. | |
| 5,091,769 A | 2/1992 | Eichelberger | |
| 5,111,278 A | 5/1992 | Eichelberger | |
| 5,120,678 A | 6/1992 | Moore et al. | |
| 5,149,662 A | 9/1992 | Eichelberger | |
| 5,151,776 A | 9/1992 | Wojnarowski et al. | |
| 5,157,589 A | 10/1992 | Cole, Jr. et al. | |
| 5,225,023 A | 7/1993 | Wojnarowski et al. | |
| 5,241,456 A | 8/1993 | Marcinkiewicz et al. | |
| 5,250,843 A | 10/1993 | Eichelberger | |
| 5,315,486 A | 5/1994 | Fillion et al. | |
| 5,324,687 A | 6/1994 | Wojnarowski | |
| 5,353,195 A | 10/1994 | Fillion et al. | |
| 5,353,498 A | 10/1994 | Fillion et al. | |
| 5,422,513 A | 6/1995 | Marcinkiewicz et al. | |
| 5,519,936 A | 5/1996 | Andros et al. | |
| 5,527,741 A | 6/1996 | Cole et al. | |
| 5,546,654 A | 8/1996 | Wojnarowski et al. | |
| 5,554,887 A | 9/1996 | Sawai et al. | |

(Continued)

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".
Ding et al., U.S. Appl. No. 12/753,837, filed Apr. 2, 2010 for "Wafer-Level Semiconductor Device Packages with Stacking Functionality."
Chen et al., U.S. Appl. No. 12/753,843, filed Apr. 2, 2010 for "Stacked Semiconductor Device Package Assemblies with Reduced Wire Sweep and Manufacturing Methods Thereof."

(Continued)

*Primary Examiner* — Bradley K Smith
*Assistant Examiner* — Amar Movva
(74) *Attorney, Agent, or Firm* — Foley & Lardner LLP

(57) ABSTRACT

In one embodiment, a method of forming a semiconductor device package includes: (1) providing a carrier and a semiconductor device including an active surface; (2) forming a first redistribution structure including a first electrical interconnect extending laterally within the first structure and a plurality of second electrical interconnects extending vertically from a first surface of the first interconnect, each second interconnect including a lower surface adjacent to the first surface and an upper surface opposite the lower surface; (3) disposing the device on the carrier such that the active surface is adjacent to the carrier; (4) disposing the first structure on the carrier such that the upper surface of each second interconnect is adjacent to the carrier, and the second interconnects are positioned around the device; and (5) forming a second redistribution structure adjacent to the active surface, and including a third electrical interconnect extending laterally within the second structure.

20 Claims, 8 Drawing Sheets

U.S. PATENT DOCUMENTS

| | | | |
|---|---|---|---|
| 5,567,656 | A | 10/1996 | Chun |
| 5,703,400 | A | 12/1997 | Wojnarowski et al. |
| 5,710,062 | A | 1/1998 | Sawai et al. |
| 5,745,984 | A | 5/1998 | Cole, Jr. et al. |
| 5,834,340 | A | 11/1998 | Sawai et al. |
| 5,841,193 | A | 11/1998 | Eichelberger |
| 5,866,952 | A | 2/1999 | Wojnarowski et al. |
| 6,046,071 | A | 4/2000 | Sawai et al. |
| 6,080,932 | A | 6/2000 | Smith et al. |
| 6,159,767 | A | 12/2000 | Eichelberger |
| 6,232,151 | B1 | 5/2001 | Ozmat et al. |
| 6,239,482 | B1 | 5/2001 | Fillion et al. |
| 6,265,765 | B1 | 7/2001 | DiStefano et al. |
| 6,294,741 | B1 | 9/2001 | Cole, Jr. et al. |
| 6,306,680 | B1 | 10/2001 | Fillion et al. |
| 6,358,780 | B1 | 3/2002 | Smith et al. |
| 6,377,461 | B1 | 4/2002 | Ozmat et al. |
| 6,396,148 | B1 | 5/2002 | Eichelberger et al. |
| 6,426,545 | B1 | 7/2002 | Eichelberger et al. |
| 6,486,006 | B2 | 11/2002 | Hirano et al. |
| 6,555,908 | B1 | 4/2003 | Eichelberger |
| 6,586,822 | B1 | 7/2003 | Vu et al. |
| 6,680,529 | B2 | 1/2004 | Chen et al. |
| 6,701,614 | B2 | 3/2004 | Ding et al. |
| 6,818,544 | B2 | 11/2004 | Eichelberger et al. |
| 6,838,776 | B2 | 1/2005 | Leal et al. |
| 6,845,554 | B2 | 1/2005 | Frankowsky et al. |
| 6,921,683 | B2 | 7/2005 | Nakayama |
| 6,921,975 | B2 | 7/2005 | Leal et al. |
| 6,953,708 | B2 | 10/2005 | Hedler et al. |
| 7,015,075 | B2 | 3/2006 | Fay et al. |
| 7,045,908 | B2 | 5/2006 | Ohsumi |
| 7,048,450 | B2 | 5/2006 | Beer et al. |
| 7,087,991 | B2 | 8/2006 | Chen et al. |
| 7,091,595 | B2 | 8/2006 | Fuergut et al. |
| 7,112,467 | B2 | 9/2006 | Eichelberger et al. |
| 7,141,884 | B2 | 11/2006 | Kojima et al. |
| 7,145,228 | B2 | 12/2006 | Yean et al. |
| 7,163,843 | B2 | 1/2007 | Kiendl et al. |
| 7,294,791 | B2 | 11/2007 | Danoski et al. |
| 7,344,917 | B2 | 3/2008 | Gautham |
| 7,361,533 | B1 | 4/2008 | Huemoeller et al. |
| 7,361,987 | B2 | 4/2008 | Leal et al. |
| 7,364,944 | B2 | 4/2008 | Huang et al. |
| 7,371,617 | B2 | 5/2008 | Tsai et al. |
| 7,425,464 | B2 | 9/2008 | Fay et al. |
| 7,453,148 | B2 | 11/2008 | Yang et al. |
| 7,476,563 | B2 | 1/2009 | Mangrum et al. |
| 7,482,198 | B2 | 1/2009 | Bauer et al. |
| 7,501,310 | B2 | 3/2009 | Yang et al. |
| 7,511,365 | B2 | 3/2009 | Wu et al. |
| 7,514,767 | B2 | 4/2009 | Yang |
| 7,566,969 | B2 | 7/2009 | Shimanuki |
| 7,575,173 | B2 | 8/2009 | Fuergut et al. |
| 7,588,951 | B2 | 9/2009 | Mangrum et al. |
| 7,595,226 | B2 | 9/2009 | Lytle et al. |
| 7,595,553 | B2 | 9/2009 | Nagamatsu et al. |
| 7,619,304 | B2 | 11/2009 | Bauer et al. |
| 7,619,901 | B2 | 11/2009 | Eichelberger et al. |
| 7,622,733 | B2 | 11/2009 | Fuergut et al. |
| 7,655,501 | B2 | 2/2010 | Yang et al. |
| 7,662,667 | B2 | 2/2010 | Shen |
| 7,667,318 | B2 | 2/2010 | Yang et al. |
| 7,675,157 | B2 | 3/2010 | Liu et al. |
| 7,692,286 | B1 | 4/2010 | Huemoeller et al. |
| 7,714,431 | B1 | 5/2010 | Huemoeller et al. |
| 7,727,803 | B2 | 6/2010 | Yamagata |
| 7,732,242 | B2 | 6/2010 | Brunnbauer et al. |
| 7,741,151 | B2 | 6/2010 | Amrine et al. |
| 7,759,163 | B2 | 7/2010 | Kroeninger et al. |
| 7,763,976 | B2 | 7/2010 | Tang et al. |
| 7,767,495 | B2 | 8/2010 | Fuergut et al. |
| 7,807,512 | B2 | 10/2010 | Lee et al. |
| 7,812,434 | B2 | 10/2010 | Yang |
| 7,830,004 | B2 | 11/2010 | Wu et al. |
| 7,834,464 | B2 | 11/2010 | Meyer et al. |
| 7,932,599 | B2 | 4/2011 | Kiendl et al. |
| 7,948,090 | B2 | 5/2011 | Manepalli et al. |
| 8,017,515 | B2 | 9/2011 | Marimuthu et al. |
| 8,035,213 | B2 | 10/2011 | Lee et al. |
| 8,039,303 | B2 | 10/2011 | Shim et al. |
| 8,110,916 | B2 | 2/2012 | Weng et al. |
| 8,193,647 | B2 | 6/2012 | Hsieh et al. |
| 2003/0090883 | A1 | 5/2003 | Asahi et al. |
| 2004/0012099 | A1 | 1/2004 | Nakayama |
| 2004/0178500 | A1 | 9/2004 | Usui |
| 2005/0253244 | A1 | 11/2005 | Chang |
| 2006/0065387 | A1 | 3/2006 | Tonapi et al. |
| 2006/0071315 | A1 | 4/2006 | Oh et al. |
| 2006/0231944 | A1 | 10/2006 | Huang et al. |
| 2007/0096311 | A1 | 5/2007 | Humpston et al. |
| 2007/0176281 | A1 | 8/2007 | Kim et al. |
| 2007/0190690 | A1 | 8/2007 | Chow et al. |
| 2007/0222054 | A1 | 9/2007 | Hembree |
| 2007/0234563 | A1 | 10/2007 | Sakaguchi et al. |
| 2008/0137314 | A1 | 6/2008 | Salama et al. |
| 2008/0316714 | A1 | 12/2008 | Eichelberger et al. |
| 2009/0075428 | A1 | 3/2009 | Tang et al. |
| 2009/0101400 | A1 | 4/2009 | Yamakoshi |
| 2009/0102066 | A1 | 4/2009 | Lee et al. |
| 2009/0127686 | A1 | 5/2009 | Yang et al. |
| 2009/0129037 | A1 | 5/2009 | Yoshino |
| 2009/0224391 | A1 | 9/2009 | Lin et al. |
| 2009/0236686 | A1 | 9/2009 | Shim et al. |
| 2009/0261466 | A1 | 10/2009 | Pagaila et al. |
| 2010/0006330 | A1 | 1/2010 | Fu et al. |
| 2010/0006994 | A1 | 1/2010 | Shim et al. |
| 2010/0072599 | A1 | 3/2010 | Camacho et al. |
| 2010/0072618 | A1 | 3/2010 | Camacho et al. |
| 2010/0084759 | A1 | 4/2010 | Shen |
| 2010/0096739 | A1 | 4/2010 | Kawabata et al. |
| 2010/0109132 | A1 | 5/2010 | Ko et al. |
| 2010/0214780 | A1 | 8/2010 | Villard |
| 2010/0224983 | A1 | 9/2010 | Huang et al. |
| 2010/0244208 | A1 | 9/2010 | Pagaila et al. |
| 2010/0308449 | A1 | 12/2010 | Yang et al. |
| 2010/0314746 | A1 | 12/2010 | Hsieh et al. |
| 2010/0320585 | A1 | 12/2010 | Jiang et al. |
| 2010/0320593 | A1 | 12/2010 | Weng et al. |
| 2011/0018118 | A1 | 1/2011 | Hsieh et al. |
| 2011/0018124 | A1 | 1/2011 | Yang et al. |
| 2011/0037169 | A1 | 2/2011 | Pagaila et al. |
| 2011/0068453 | A1 | 3/2011 | Cho et al. |
| 2011/0068459 | A1 | 3/2011 | Pagaila et al. |
| 2011/0074008 | A1 | 3/2011 | Hsieh |
| 2011/0115060 | A1 | 5/2011 | Chiu et al. |
| 2011/0127654 | A1 | 6/2011 | Weng et al. |
| 2011/0140364 | A1 | 6/2011 | Head |
| 2011/0169150 | A1 | 7/2011 | Su et al. |
| 2011/0194265 | A1 | 8/2011 | Su et al. |
| 2011/0227220 | A1 | 9/2011 | Chen et al. |
| 2011/0241192 | A1 | 10/2011 | Ding et al. |
| 2011/0241193 | A1 | 10/2011 | Ding et al. |
| 2011/0241194 | A1 | 10/2011 | Chen et al. |
| 2011/0278741 | A1 | 11/2011 | Chua et al. |
| 2011/0309488 | A1 | 12/2011 | Pagaila |
| 2012/0038053 | A1 | 2/2012 | Oh et al. |
| 2012/0056321 | A1 | 3/2012 | Pagaila |
| 2012/0077311 | A1 | 3/2012 | Kim et al. |
| 2012/0119373 | A1 | 5/2012 | Hunt et al. |
| 2012/0153472 | A1 | 6/2012 | Pagaila et al. |
| 2012/0153493 | A1 | 6/2012 | Lee et al. |
| 2012/0175732 | A1 | 7/2012 | Lin et al. |
| 2012/0199972 | A1 | 8/2012 | Pagaila et al. |

OTHER PUBLICATIONS

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

WAFER-LEVEL SEMICONDUCTOR DEVICE PACKAGES WITH THREE-DIMENSIONAL FAN-OUT AND MANUFACTURING METHODS THEREOF

FIELD OF THE INVENTION

The invention relates generally to semiconductor device packages. More particularly, the invention relates to wafer-level semiconductor device packages with three-dimensional fan-out and manufacturing methods thereof.

BACKGROUND

Semiconductor devices have become progressively more complex, driven at least in part by the demand for smaller sizes and enhanced processing speeds. While the benefits of smaller sizes and enhanced processing speeds are apparent, these characteristics of semiconductor devices also can create problems.

In conventional wafer-level packaging, semiconductor devices within a wafer are packaged prior to singulation of the wafer. As such, conventional wafer-level packaging can be restricted to a fan-in configuration, namely electrical contacts and other components of a resulting semiconductor device package are restricted to an area defined by a periphery of a semiconductor device. Any component disposed outside of the periphery of the semiconductor device typically is not supported and typically is removed upon singulation. The restriction of a fan-in configuration presents challenges as device sizes continue to shrink.

It is against this background that a need arose to develop the wafer-level semiconductor device packages and related methods described herein.

SUMMARY

One aspect of the invention relates to a method of forming a semiconductor device package. In one embodiment, the method includes providing a carrier and a semiconductor device including an active surface. The method further includes forming a first redistribution structure including a first electrical interconnect extending laterally within the first redistribution structure and a plurality of second electrical interconnects extending vertically from a first surface of the first electrical interconnect, each of the plurality of second electrical interconnects including a lower surface adjacent to the first surface and an upper surface opposite the lower surface. The method further includes disposing the semiconductor device on the carrier such that the active surface is adjacent to the carrier, and disposing the first redistribution structure on the carrier such that: (a) the upper surface of each of the plurality of second electrical interconnects is adjacent to the carrier; and (b) the plurality of second electrical interconnects are positioned around the semiconductor device. The method further includes forming a second redistribution structure adjacent to the active surface of the semiconductor device, the second redistribution structure including a third electrical interconnect extending laterally within the second redistribution structure.

In another embodiment, a method of forming a semiconductor device package includes providing a semiconductor device including an active surface, a lateral surface, and an upper surface opposite the active surface. The method further includes forming a first redistribution structure including a first electrical interconnect extending laterally within the first redistribution structure and a plurality of second electrical interconnects extending vertically from a first surface of the first electrical interconnect, each of the plurality of second electrical interconnects including a lower surface adjacent to the first surface, a lateral surface, and an upper surface opposite to the lower surface. The method further includes disposing the semiconductor device and the first redistribution structure such that: (a) the active surface and the upper surface of each of the plurality of second electrical interconnects are substantially co-planar; (b) a first gap is formed between the first electrical interconnect and the upper surface of the semiconductor device; and (c) a second gap is formed around the semiconductor device, the second gap separating the lateral surface of the semiconductor device and the lateral surface of each of the plurality of second electrical interconnects. The method further includes applying a molding material to form a molded structure substantially filling the first gap and the second gap, and substantially covering the first surface. The method further includes forming a second redistribution structure adjacent to the active surface of the semiconductor device, the second redistribution structure including a third electrical interconnect extending laterally within the second redistribution structure.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings. In the drawings, like reference numbers denote like elements, unless the context clearly dictates otherwise.

DETAILED DESCRIPTION

Definitions

Figure 1:
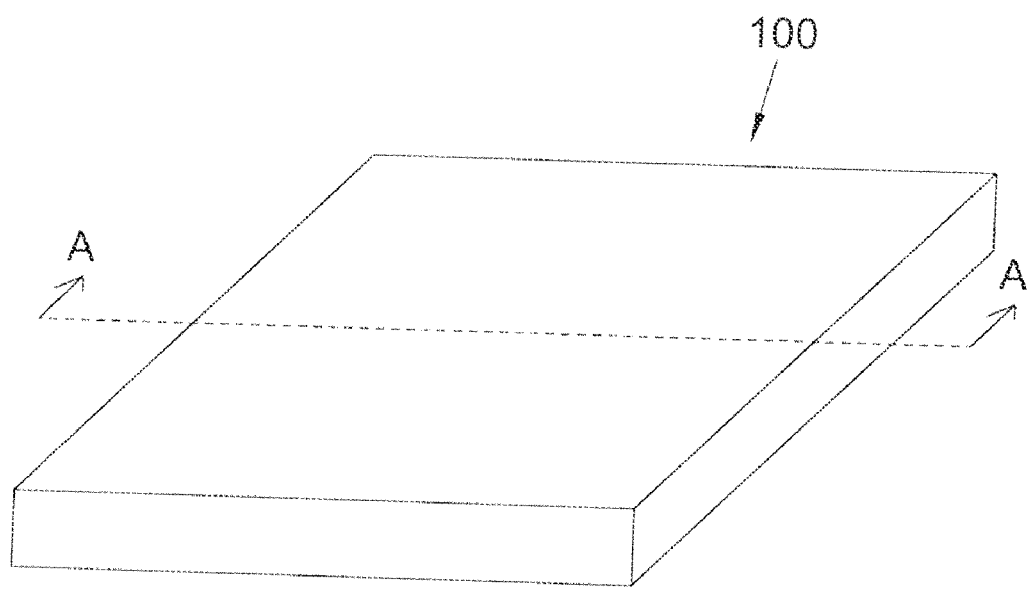
FIG. 1 illustrates a perspective view of a semiconductor device package implemented in accordance with an embodiment of the invention.

The following definitions apply to some of the aspects described with respect to some embodiments of the invention. These definitions may likewise be expanded upon herein:

As used herein, the singular terms "a," "an," and "the" include plural referents unless the context clearly dictates otherwise. Thus, for example, reference to an electrical interconnect can include multiple electrical interconnects unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another, such as in accordance with the drawings, but do not require a particular orientation of those components during manufacturing or use.

As used herein, the terms "connect," "connected," and "connection" refer to an operational coupling or linking. Connected components can be directly coupled to one another or can be indirectly coupled to one another, such as through another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "electrically conductive" and "electrical conductivity" refer to an ability to transport an electric current. Electrically conductive materials typically correspond to those materials that exhibit little or no opposition to flow of an electric current. One measure of electrical conductivity is in terms of Siemens per meter ("$S \cdot m^{-1}$"). Typically, an electrically conductive material is one having a conductivity greater than about $10^4$ $S \cdot m^{-1}$, such as at least about $10^5$ $S \cdot m^{-1}$ or at least about $10^6$ $S \cdot m^{-1}$. Electrical conductivity of a material can sometimes vary with temperature. Unless otherwise specified, electrical conductivity of a material is defined at room temperature.

Figure 2:
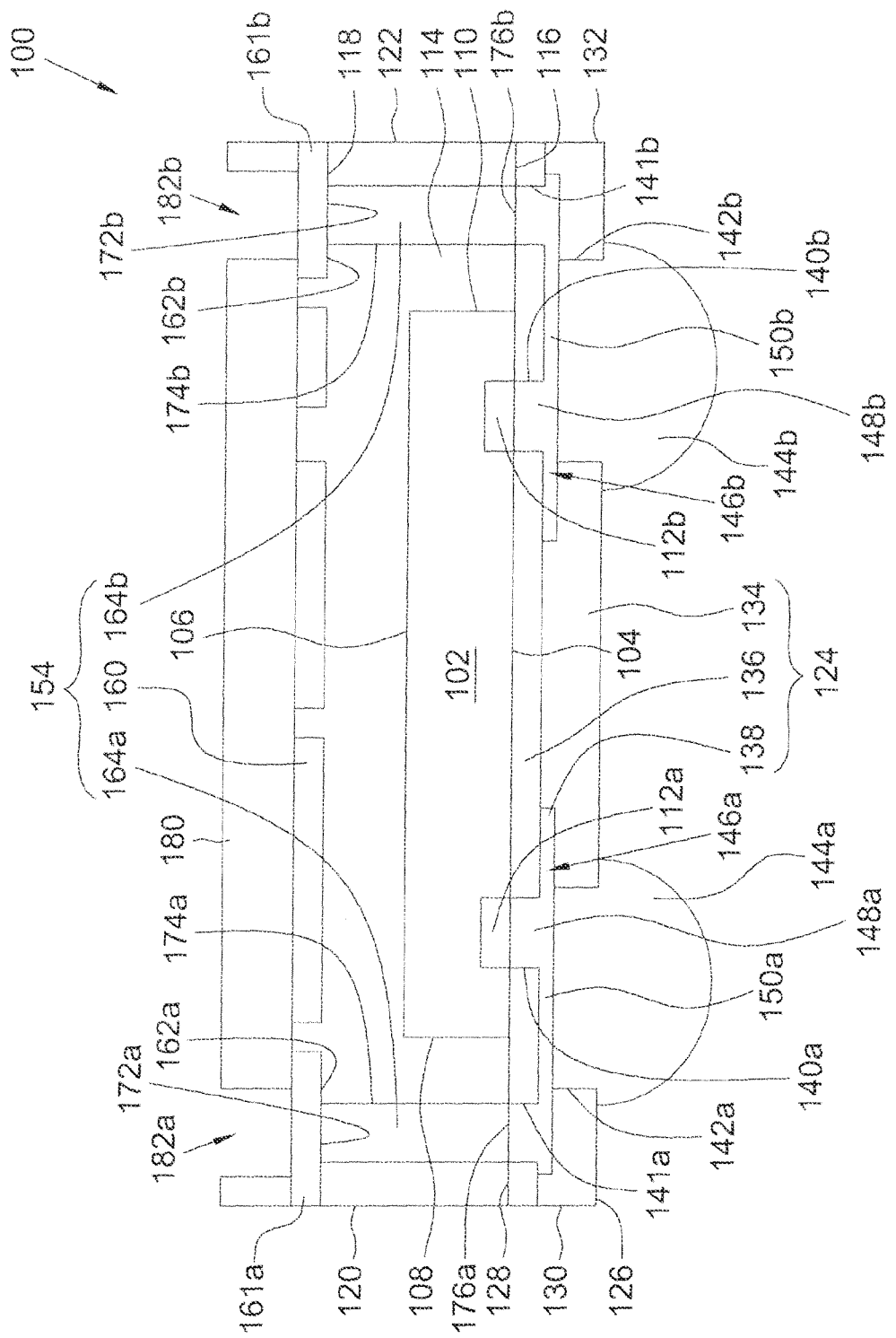
FIG. 2 illustrates a cross-sectional view of the package of FIG. 1, taken along line A-A of FIG. 1.

Attention first turns to FIG. 1 and FIG. 2, which illustrate a semiconductor device package 100 implemented in accordance with an embodiment of the invention. In particular, FIG. 1 illustrates a perspective view of the package 100, while FIG. 2 illustrates a cross-sectional view of the package 100, taken along line A-A of FIG. 1.

In the illustrated embodiment, sides of the package 100 are substantially planar and have a substantially orthogonal orientation so as to define a lateral profile that extends around substantially an entire periphery of the package 100. Advantageously, this orthogonal lateral profile allows a reduced overall package size by reducing or minimizing a footprint area of the package 100. However, it is contemplated that the lateral profile of the package 100, in general, can be any of a number of shapes, such as curved, inclined, stepped, or roughly textured.

Referring to FIG. 2, the package 100 includes a semiconductor device 102, which includes a lower surface 104, an upper surface 106, and lateral surfaces 108 and 110 disposed adjacent to a periphery of the semiconductor device 102 and extending between the lower surface 104 and the upper surface 106. In the illustrated embodiment, each of the surfaces 104, 106, 108, and 110 is substantially planar, with the lateral surfaces 108 and 110 having a substantially orthogonal orientation with respect to the lower surface 104 or the upper surface 106, although it is contemplated that the shapes and orientations of the surfaces 104, 106, 108, and 110 can vary for other implementations. As illustrated in FIG. 2, the upper surface 106 is a back surface of the semiconductor device 102, while the lower surface 104 is an active surface of the semiconductor device 102 that has contact pads 112a and 112b disposed adjacent thereto. The contact pads 112a and 112b provide input and output electrical connections for the semiconductor device 102. In the illustrated embodiment, the semiconductor device 102 is a semiconductor chip, although it is contemplated that the semiconductor device 102, in general, can be any active device, any passive device, or a combination thereof. While one semiconductor device is illustrated in FIG. 2, it is contemplated that additional semiconductor devices can be included for other implementations.

As illustrated in FIG. 2, the package 100 also includes a package body 114 that is disposed adjacent to the semiconductor device 102. In conjunction with a redistribution unit 124 and an interconnection unit 154 that are further described below, the package body 114 substantially covers or encapsulates the semiconductor device 102 to provide mechanical stability as well as protection against oxidation, humidity, and other environmental conditions. In the illustrated embodiment, the package body 114 substantially covers the upper surface 106 and the lateral surfaces 108 and 110 of the semiconductor device 102, with the lower surface 104 the semiconductor device 102 being substantially exposed or uncovered. However, it is contemplated that the extent of coverage by the package body 114 can be varied from that illustrated in FIG. 2. For example, it is contemplated that the package body 114 can substantially cover the lateral surfaces 108 and 110, while both the lower surface 104 and the upper surface 106 are substantially uncovered.

As illustrated in FIG. 2, the package body 114 is formed from a molding material, and includes a lower surface 116 and exterior surfaces, including an upper surface 118 and lateral surfaces 120 and 122 disposed adjacent to a periphery of the package body 114 and extending between the lower surface 116 and the upper surface 118. In the illustrated embodiment, each of the surfaces 116, 120, and 122 is substantially planar, with the lateral surfaces 120 and 122 having a substantially orthogonal orientation with respect to the lower surface 116, although it is contemplated that the shapes and orientations of the surfaces 116, 120, and 122 can vary for other implementations. The upper surface 118 is shown as extending into openings in an electrically conductive layer 160 (described below), although it is contemplated that the shape and orientation of the upper surface 118 can vary for other implementations. For example, the upper surface 118 may be substantially planar. As illustrated in FIG. 2, the periphery of the package body 114, as defined by the lateral surfaces 120 and 122, has a greater lateral extent than the periphery of the semiconductor device 102, thereby allowing the package 100 to be implemented with a fan-out configuration, namely components of the package 100 can be disposed within as well as outside of an area defined by the periphery of the semiconductor device 102. Also, the lower surface 116 of the package body 114 is substantially aligned or co-planar with the lower surface 104 of the semiconductor device 102, thereby defining a front surface that is substantially planar. More particularly, this alignment is accomplished while allowing the lower surface 104 to be substantially exposed or uncovered, such as by reducing or minimizing coverage of the contact pads 112a and 112b. For other implementations, it is contemplated that the alignment of the lower surfaces 104 and 116 can be varied from that illustrated in FIG. 2, while allowing the lower surface 104 to be at least partially electrically exposed to allow input and output electrical connections to the contact pads 112a and 112b. It is also contemplated that the package body 114 can include a supporting structure in conjunction with, or in place of, a molding material. For example, the package body 114 can include a frame or an interposer, which can be formed from glass, silicon, a metal, a metal alloy, a polymer, or another suitable structural material.

Referring to FIG. 2, the package 100 also includes the redistribution unit 124, which is disposed adjacent to the front surface defined by the lower surfaces 104 and 116. The redistribution unit 124 is electrically connected to the semiconductor device 102, and provides electrical pathways as well as mechanical stability and protection against environmental conditions. As illustrated in FIG. 2, the redistribution unit 124 includes a lower surface 126, an upper surface 128, and lateral surfaces 130 and 132 disposed adjacent to a periphery of the redistribution unit 124 and extending between the lower surface 126 and the upper surface 128. In the illustrated embodiment, each of the surfaces 126, 128, 130, and 132 is substantially planar, with the lateral surfaces 130 and 132 having a substantially orthogonal orientation with respect to the lower surface 126 or the upper surface 128, although it is contemplated that the shapes and orientations of the surfaces 126, 128, 130, and 132 can vary for other implementations. The periphery of the redistribution unit 124, as defined by the lateral surfaces 130 and 132 and as supported by the package body 114, has a greater lateral extent than the periphery of the semiconductor device 102, thereby allowing the package 100 to be implemented with the fan-out configuration. Also, the lateral surfaces 130 and 132 of the redistribution unit 124 are substantially aligned or co-planar with the lateral surfaces 120 and 122 of the package body 114, respectively. More particularly, this alignment is accomplished while allowing the lateral surfaces 130 and 132 to be substantially exposed or uncovered, such as by reducing or minimizing coverage of the lateral surfaces 130 and 132. For other implementations, it is contemplated that the alignment of the lateral surfaces 120, 122, 130, and 132 can be varied from that illustrated in FIG. 2.

Still referring to FIG. 2, the redistribution unit 124 is formed in situ during manufacturing as a set of redistribution layers, although it is contemplated that the redistribution unit 124 can include a preformed structure for other implementations. In the illustrated embodiment, the redistribution unit 124 is multi-layered and includes a pair of dielectric layers 134 and 136 and an electrically conductive layer 138 that is at least partially sandwiched by the dielectric layers 134 and 136. In general, each of the dielectric layers 134 and 136 can be formed from a dielectric material that is polymeric or non-polymeric. For example, at least one of the dielectric layers 134 and 136 can be formed from polyimide, polybenzoxazole, benzocyclobutene, or a combination thereof. The dielectric layers 134 and 136 can be formed from the same dielectric material or different dielectric materials. For certain implementations, at least one of the dielectric layers 134 and 136 can be formed from a dielectric material that is photoimageable or photoactive, thereby reducing manufacturing cost and time by allowing patterning using photolithography. While two dielectric layers 134 and 136 are illustrated in FIG. 2 as part of the redistribution unit 124, it is contemplated that more or less dielectric layers can be included in the redistribution unit 124 for other implementations.

As illustrated in FIG. 2, the dielectric layer 136 is formed so as to define openings 140a and 140b, which are aligned and sized so as to at least partially expose the contact pads 112a and 112b, respectively. The dielectric layer 134 is formed so as to define openings 142a and 142b, which are aligned so as to at least partially expose the electrically conductive layer 138, and are sized so as to accommodate electrical contacts 144a and 144b. The electrical contacts 144a and 144b provide input and output electrical connections for the package 100, and at least one of the electrical contacts 144a and 144b is electrically connected to the semiconductor device 102 through the electrically conductive layer 138. In the illustrated embodiment, the electrical contacts 144a and 144b are implemented as solder bumps. In accordance with the fan-out configuration of the package 100, the electrical contacts 144a and 144b are laterally disposed outside of the periphery of the semiconductor device 102, although it is contemplated that the electrical contacts 144a and 144b, in general, can be laterally disposed within that periphery, outside of that periphery, or both. In such manner, the fan-out configuration of the package 100 allows greater flexibility in terms of the arrangement and spacing of the electrical contacts 144a and 144b, with reduced dependence upon the arrangement and spacing of the contact pads 112a and 112b of the semiconductor device 102.

The electrically conductive layer 138 serves as a redistribution network for the contact pads 112a and 112b of the semiconductor device 102, and, in accordance with the fan-out configuration of the package 100, the electrically conductive layer 138 extends laterally within the redistribution unit 124 and outside of the periphery of the semiconductor device 102. As illustrated in FIG. 2, the electrically conductive layer 138 includes an electrical interconnect 146a, which electrically connects the contact pad 112a to the electrical contact 144a, and an electrical interconnect 146b, which electrically connects the contact pad 112b to the electrical contact 144b. More particularly, each of the electrical interconnects 146a and 146b is formed so as to include one portion disposed within a respective one of the openings 140a and 140b, namely a via 148a or 148b that is electrically connected to the contact pad 112a or 112b, and another portion extending along a lower surface of the dielectric layer 136, namely an electrical trace 150a or 150b that is electrically connected to the electrical contact 144a or 144b. In general, each of the electrical interconnects 146a and 146b can be formed from a metal, a metal alloy, a matrix with a metal or a metal alloy dispersed therein, or another suitable electrically conductive material. For example, at least one of the electrical interconnects 146a and 146b can be formed from aluminum, copper, titanium, or a combination thereof. The electrical interconnects 146a and 146b can be formed from the same electrically conductive material or different electrically conductive materials. While one electrically conductive layer 138 is illustrated in FIG. 2 as part of the redistribution unit 124, it is contemplated that additional electrically conductive layers can be included in the redistribution unit 124 for other implementations.

As illustrated in FIG. 2, the package 100 further includes an interconnection unit 154 (or redistribution unit 154) including an electrically conductive layer 160 and electrical interconnects 164a and 164b. The electrically conductive layer 160 may include an electrical interconnect 161a, which may electrically connect the electrical interconnect 164a to an electrical contact (not shown) or another electrical interconnect (not shown). The electrical interconnect 161a has a first surface 162a. In one embodiment, the electrical interconnect 161a may be adjacent to the electrical contact or the another electrical interconnect at an opening 182a in a protection layer 180 adjacent to the electrically conductive layer 160. The electrically conductive layer 160 may also include an electrical interconnect 161b, which may electrically connect the electrical interconnect 164b to an electrical contact (not shown) or another electrical interconnect (not shown). The electrical interconnect 161*b* has a first surface 162*b*. In one embodiment, the electrical interconnect 161*b* may be adjacent to the electrical contact or the another electrical interconnect at an opening 182*b* in the protection layer 180. The electrical interconnects 161*a* and 161*b* may extend laterally within the interconnection unit 154.

The electrical interconnects 164*a* and 164*b* have lower surfaces 172*a* and 172*b* (in an inverted orientation during manufacturing operations), lateral surfaces 174*a* and 174*b*, and upper surfaces 176*a* and 176*b* (in an inverted orientation during manufacturing operations), respectively. The electrical interconnects 164*a* and 164*b* are positioned around the semiconductor device 102, and may extend substantially vertically from the first surfaces 162*a* and 162*b*, respectively. The lower surfaces 172*a* and 172*b* may be adjacent to the first surfaces 162*a* and 162*b*, respectively. In one embodiment, the upper surfaces 176*a* and 176*b* may be substantially co-planar with the active surface 104 of the semiconductor device 102. The first surfaces 162*a* and 162*b* and the lateral surfaces 174*a* and 174*b* may be substantially covered by the package body 114.

The upper surfaces 176*a* and 176*b* may be adjacent to and electrically connected to the redistribution unit 124. In one embodiment, the dielectric layer 136 may be formed so as to define openings 141*a* and 141*b*, which are aligned and sized so as to at least partially expose electrical interconnects 164*a* and 164*b*, respectively. As illustrated in FIG. 2, the electrical interconnects 164*a* and 164*b* may be adjacent to and electrically connected to electrical interconnects 146*a* and 146*b*, respectively, resulting in the interconnection unit 154 being electrically connected to the redistribution unit 124.

The interconnection unit 154 (or redistribution unit 154) serves as a further redistribution network for the redistribution unit 124. As described previously, the redistribution unit 124 allows the package 100 to be implemented with a two-dimensional fan-out configuration by providing electrical pathways from the semiconductor device 102 to locations outside the lateral periphery of the semiconductor device 102. The interconnection unit 154 extends this to a three-dimensional fan-out by providing electrical pathways from the redistribution unit 124 (in FIG. 2, adjacent to the lower surface 116 of the package body 114) to the electrically conductive layer 160 (in FIG. 2, adjacent to the upper surface 118 of the package body 114). In such manner, the three-dimensional fan-out configuration of the package 100 advantageously increases flexibility beyond that provided by two-dimensional fan-out in terms of the arrangement and spacing of electrical contacts on an opposite side of the package 100 from the electrical contacts 144*a* and 144*b*, which further reduces dependence upon the arrangement and spacing of the contact pads 112*a* and 112*b* of the semiconductor device 102. The electrical contacts on the opposite side of the package 100 may be within and/or outside the lateral periphery of the semiconductor device 102. In addition, the interconnection unit 154 facilitates stacking of other semiconductor packages on the package 100.

The electrically conductive layer 160, the electrical interconnects 161*a* and 161*b*, and the electrical interconnects 164*a* and 164*b* can be formed similarly to electrical interconnects 146*a* and 146*b*, as described previously. For example, the electrically conductive layer 160, the electrical interconnects 161*a* and 161*b*, and the electrical interconnects 164*a* and 164*b* may be formed from copper or an alloy including copper. The electrical interconnects 161*a*, 161*b*, 164*a*, and 164*b* can be formed from the same electrically conductive material or different electrically conductive materials. While one electrically conductive layer 160 is illustrated in FIG. 2 as part of the interconnection unit 154, it is contemplated that additional electrically conductive layers can be included as part of the interconnection unit 154 for other implementations.

The protection layer 180 can be formed similarly to dielectric layers 134 and 136, as described previously. The protection layer 180 may be formed using solder mask (solder resist), such as dry film imageable solder mask, or another type of patternable layer or dielectric layer. While one protection layer 180 is illustrated in FIG. 2, it is contemplated that more or less protection layers can be included for other implementations. Openings 182*a* and 182*b* in the protection layer 180 may expose portions of the electrically conductive layer 160, such as portions of the electrical interconnects 161*a* and 161*b*. The openings 182*a* and 182*b* may be substantially aligned with the lower surfaces 172*a* and 172*b* of the electrical interconnects 164*a* and 164*b*, respectively. The protection layer 180 may be patterned to form the openings 182*a* and 182*b* similarly to the patterning of the dielectric layers 134 and 136 described previously.

Figure 3:
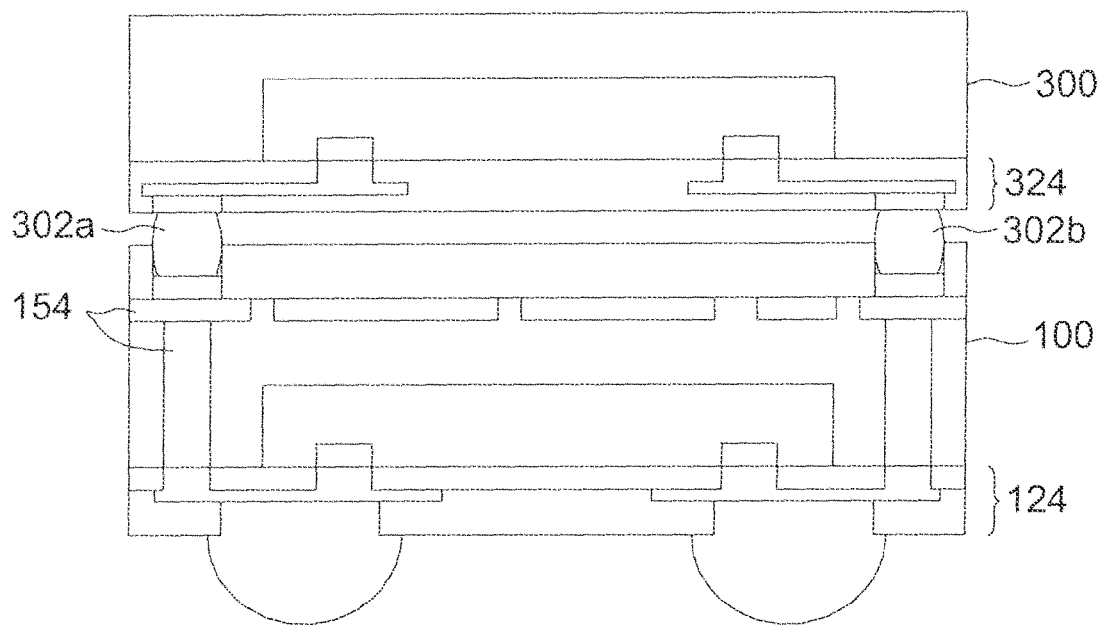
FIG. 3 illustrates a cross-sectional view of a package stacked on the package of FIG. 1 and FIG. 2, according to an embodiment of the invention.

Attention next turns to FIG. 3, which illustrates a cross-sectional view of a package 300 stacked on the package 100 of FIG. 1 and FIG. 2, according to an embodiment of the invention. As illustrated in FIG. 3, the package 300 may include a redistribution unit 324 (similar to redistribution unit 124 of the package 100), but may not include an interconnection unit similar to the interconnection unit 154 of the package 100. The redistribution unit 324 of the package 300 may be electrically connected to the interconnection unit 154 of the package 100 using electrical contacts 302*a* and 302*b*. In the illustrated embodiment, the electrical contacts 302*a* and 302*b* are implemented as solder bumps. The package 300 may be used as the top package in a stack of packages, and one or more packages 100 may be stacked below the package 300. While one package 100 is illustrated in FIG. 3 below the package 300, it is contemplated that multiple packages 100 may be stacked below the package 300 for other implementations.

Figure 4A:
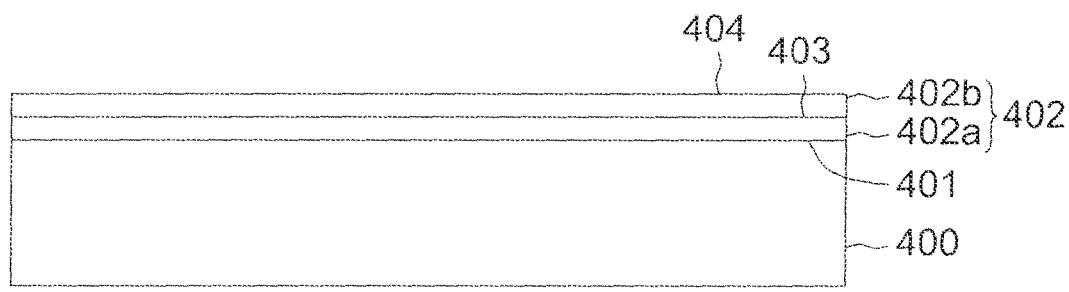
FIG. 4A through FIG. 4N illustrate a method of forming the package of FIG. 1, according to an embodiment of the invention.
Figure 4B:
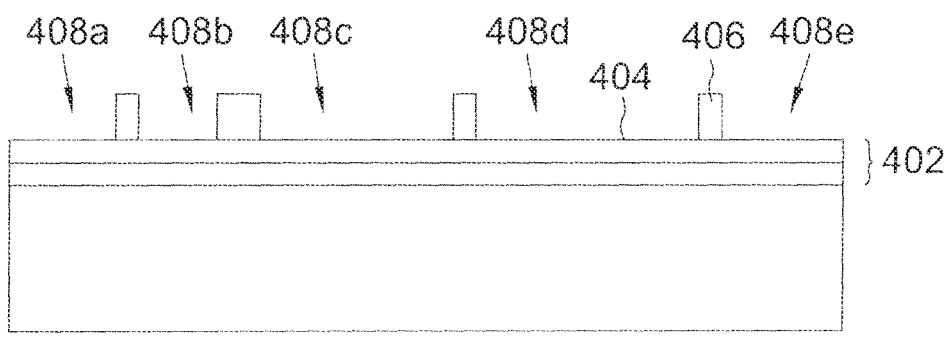
Figure 4C:
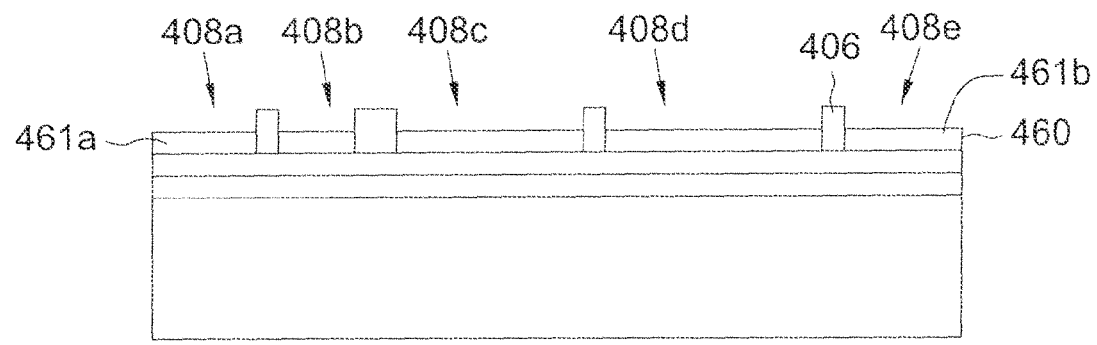
Figure 4D:
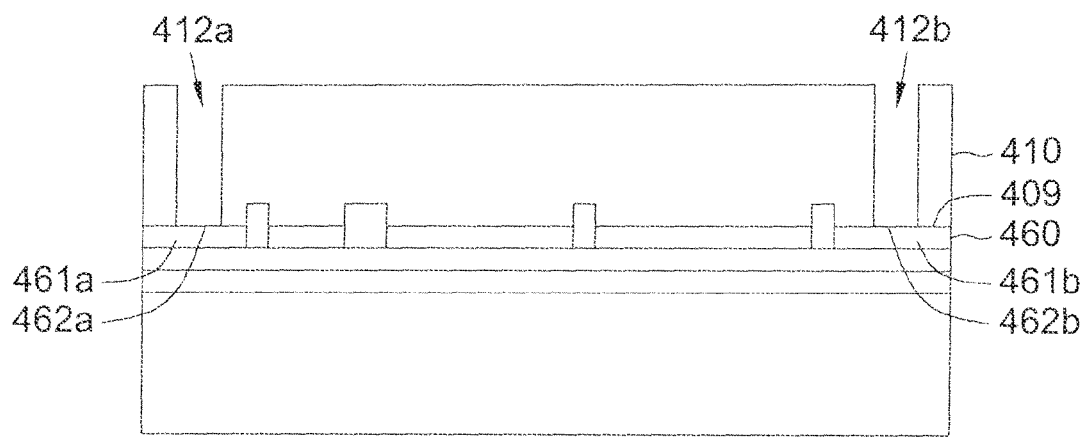
Figure 4E:
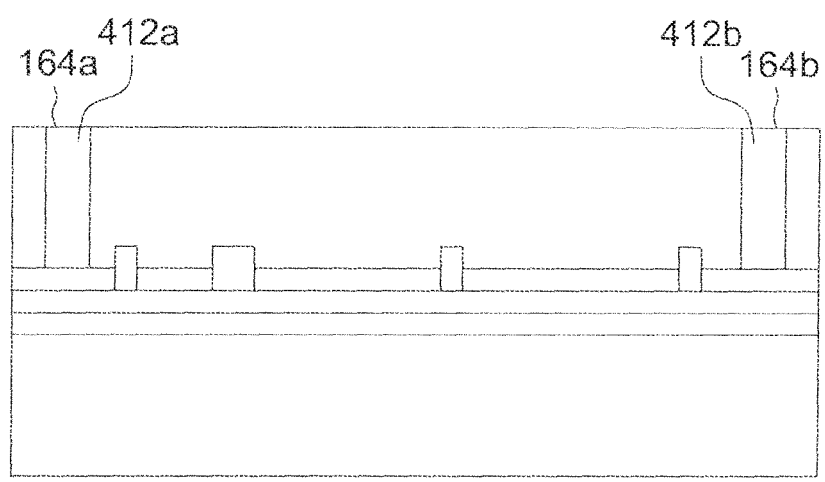
Figure 4F:
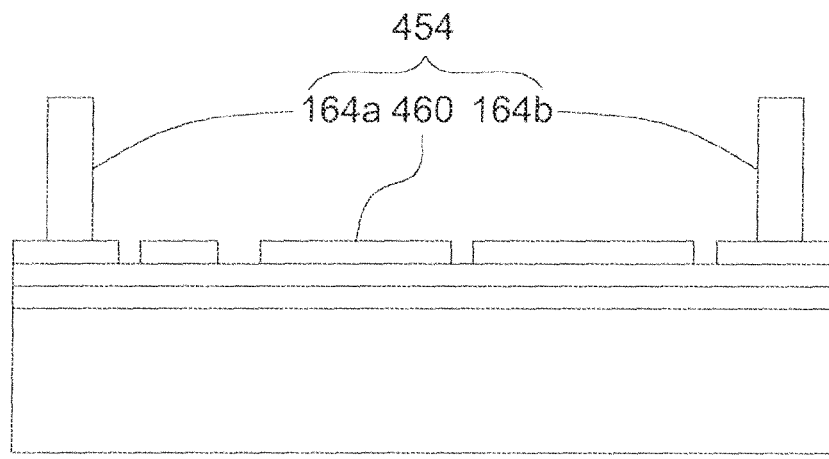
Figure 4G:
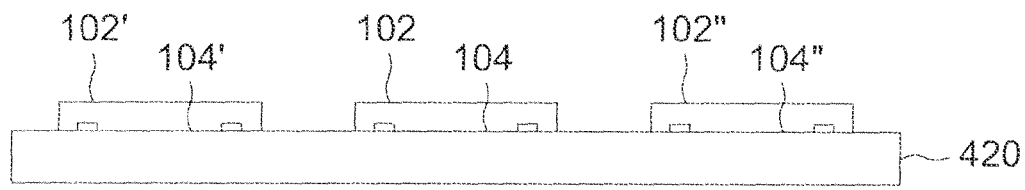
Figure 4H:
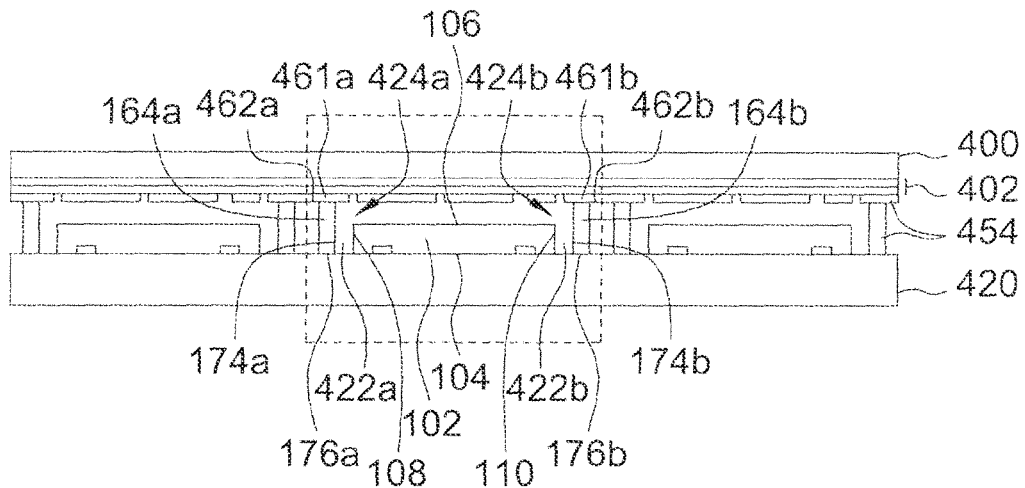
Figure 4I:
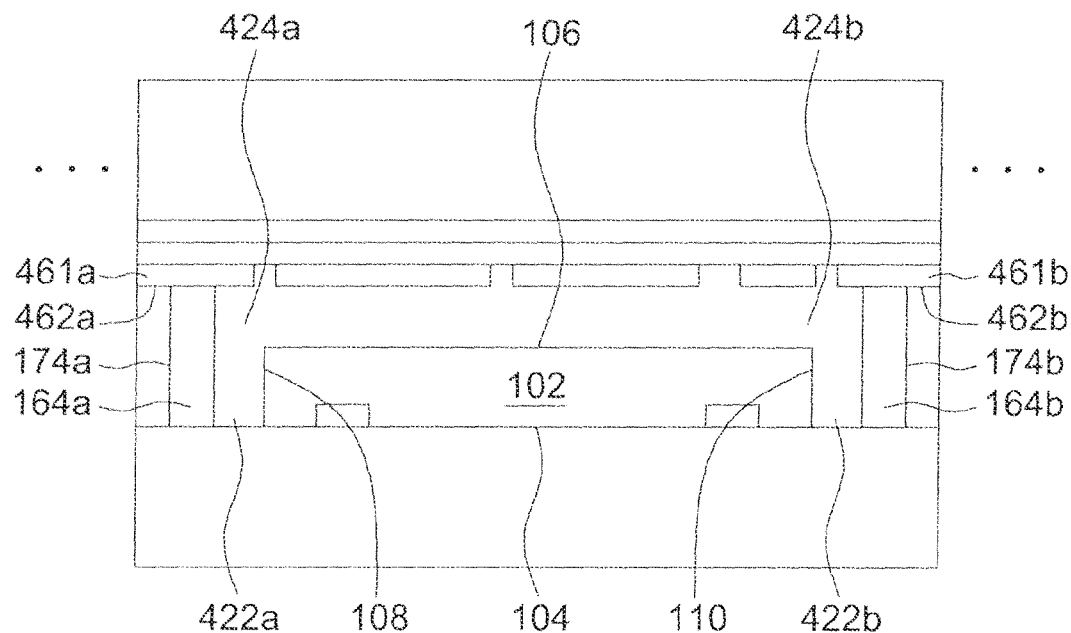
Figure 4J:
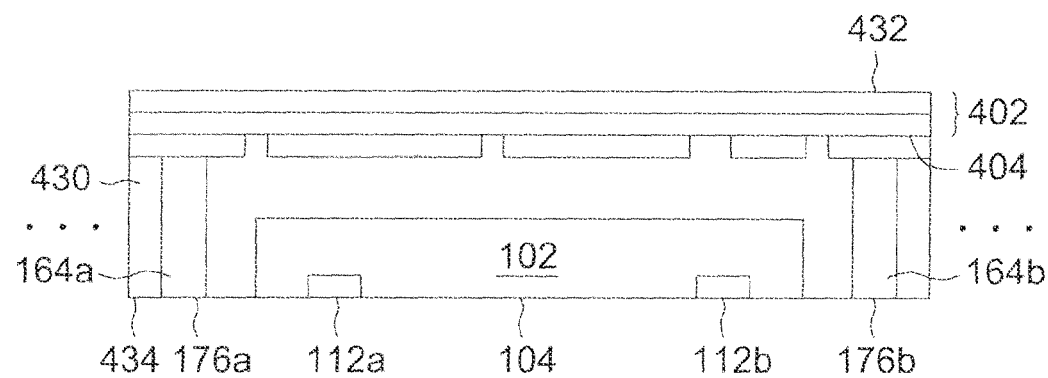
Figure 4K:
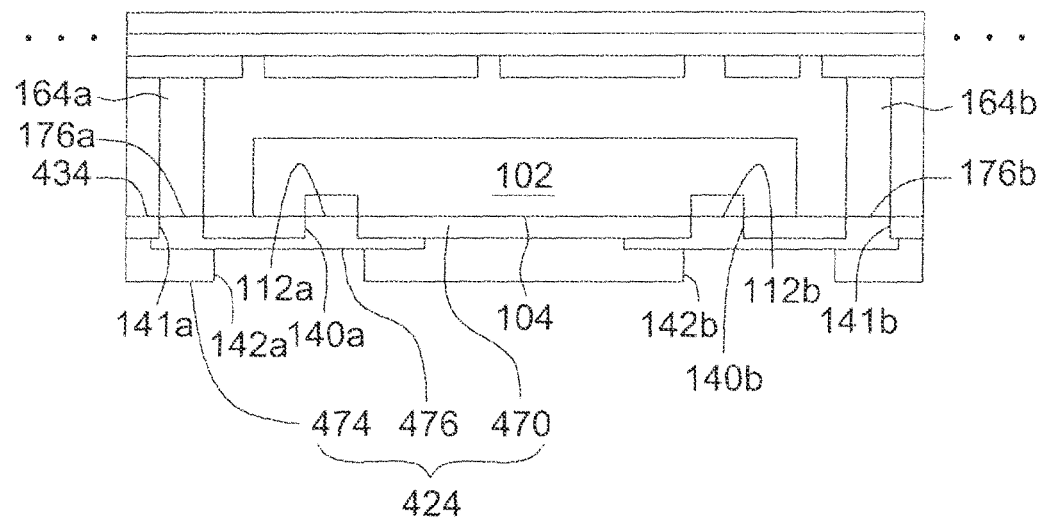
Figure 4L:
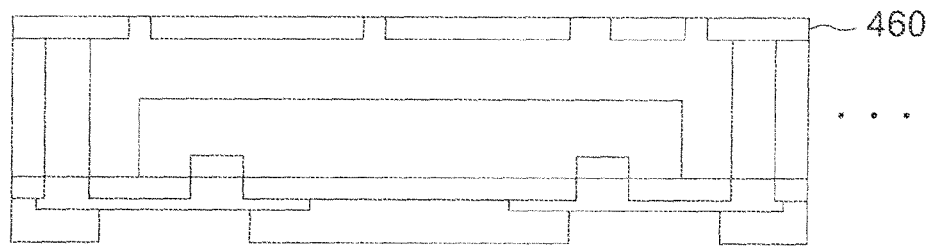
Figure 4M:
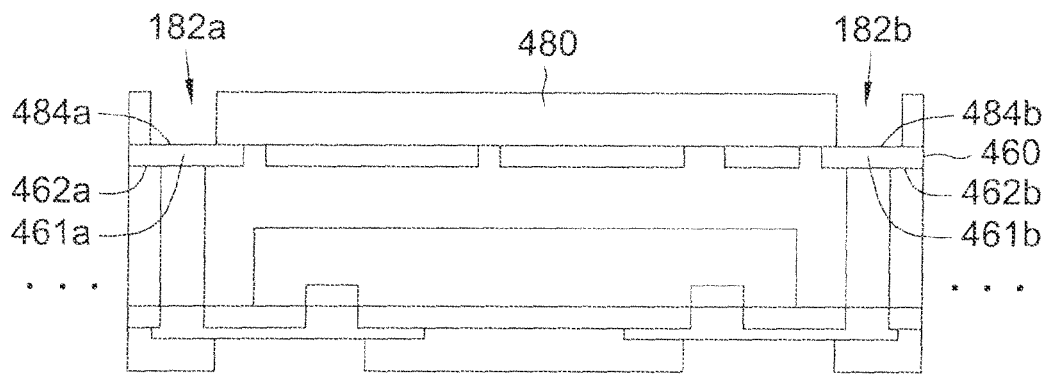
Figure 4N:
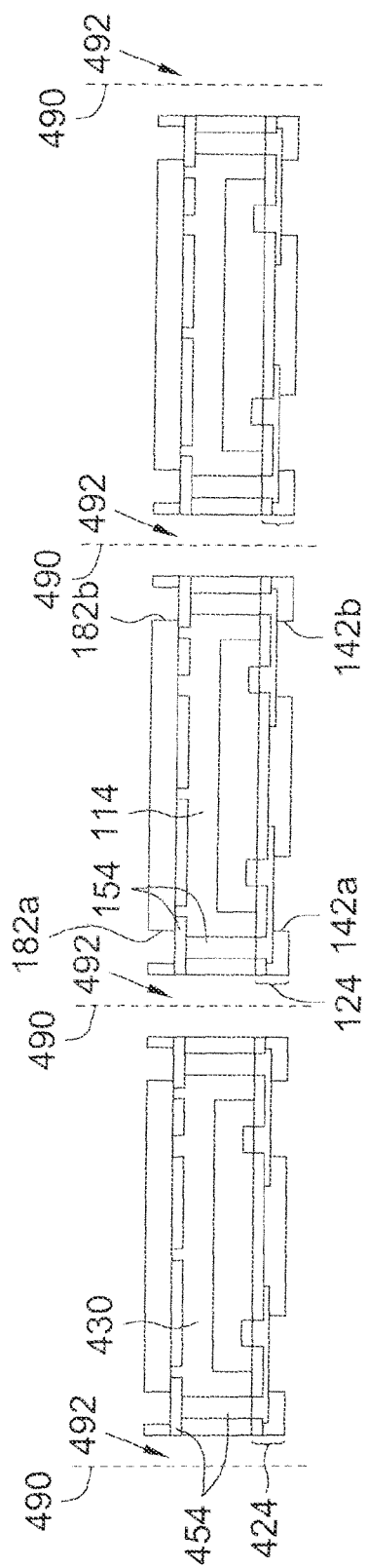

FIG. 4A through FIG. 4N illustrate a method of forming a semiconductor device package, according to an embodiment of the invention. For ease of presentation, the following manufacturing operations are described with reference to the package 100 of FIG. 1 through FIG. 3. However, it is contemplated that the manufacturing operations can be similarly carried out to form other semiconductor device packages.

Referring first to FIG. 4A, a carrier 400 is provided, and an electrically conductive layer 402 is disposed adjacent to an upper surface 401 of the carrier 400. The electrically conductive layer 402 has an upper surface 404, and may include multiple sub-layers 402*a* and 402*b*. The sub-layer 402*a* may be formed from a metal, a metal alloy, a matrix with a metal or a metal alloy dispersed therein, or another suitable electrically conductive material. For example, the sub-layer 402*a* may include a metallic foil formed from copper or an alloy including copper. The sub-layer 402*a* may be attached to the carrier 400 with a tape (not shown) disposed adjacent to the upper surface 401 of the carrier 400. The tape, which can be implemented as a single-sided or double-sided adhesive tape, secures components at an appropriate spacing with respect to one another, and allows subsequent manufacturing operations to be carried out with those components disposed adjacent to the carrier 400.

As illustrated in FIG. 4A, the sub-layer 402*b* may be applied to an upper surface 403 of the sub-layer 402*a*. The sub-layer 402*b* may be applied using any of a number of coating techniques, such as chemical vapor deposition, electroless plating, electrolytic plating, printing, spinning, spraying, sputtering, or vacuum deposition. The sub-layer 402b may be formed from a metal, a metal alloy, a matrix with a metal or a metal alloy dispersed therein, or another suitable electrically conductive material. The sub-layer 402b may be formed of an electrically conductive material different from that used to form the sub-layer 402a. For example, the sub-layer 402b may serve as an etch stop layer, and may include nickel or an alloy including nickel.

Next, as illustrated in FIG. 4B, a photoresist material may be applied to the upper surface 404 of the electrically conductive layer 402 to form a photoresist layer 406 adjacent to the upper surface 404. The photoresist material may be a dry film photoresist, or another type of patternable layer or dielectric layer. The photoresist layer 406 may be formed by coating, printing, or any other suitable technique. Predetermined or selected portions of the photoresist layer 406 may be photoimaged and developed so as to create openings, including openings 408a-408e, exposing the upper surface 404 of the electrically conductive layer 402. The photoresist layer 406 may be photochemically defined using a photomask (not shown). Photoimaging and developing may have advantages of lower cost and decreased process time as compared to other approaches for creating openings in the photoresist layer 406. The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 4C, an electrically conductive material is applied into the openings, including openings 408a-408e, defined by the photoresist layer 406 to form an electrically conductive layer 460, including electrical interconnects 461a and 461b. The electrically conductive layer 460 and the electrical interconnects 461a and 461b may extend substantially laterally, and may be formed using the same types of materials as previously described for the electrically conductive layer 160 and the electrical interconnects 161a and 161b. The electrically conductive layer 460 may be formed using any of a number of coating techniques, such as chemical vapor deposition, electroless plating, electrolytic plating, printing, spinning, spraying, sputtering, or vacuum deposition.

Next, as illustrated in FIG. 4D, a photoresist material may be applied to an upper surface 409 of the electrically conductive layer 460 to form a photoresist layer 410 adjacent to the upper surface 409, including the upper surfaces 462a and 462b of the electrical interconnects 461a and 461b, respectively. The photoresist material may be a dry film photoresist, or another type of patternable layer or dielectric layer. The photoresist layer 410 may be formed by coating, printing, or any other suitable technique. Predetermined or selected portions of the photoresist layer 410 may be photoimaged and developed so as to create openings, including openings 412a and 412b, exposing the upper surfaces 462a and 462b of the electrical interconnects 461a and 461b, respectively. Photoimaging and developing may have advantages of lower cost and decreased process time as compared to other approaches for creating openings in the photoresist layer 410. The photoresist layer 410 may be photochemically defined using a photomask (not shown). The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 4E, an electrically conductive material is applied into the openings, including openings 412a and 412b, defined by the photoresist layer 410 to form the electrical interconnects 164a and 164b. The electrical interconnects 164a and 164b may be formed using any of a number of coating techniques, such as electrolytic plating or plugging a paste composed of the electrically conductive material.

Next, as illustrated in FIG. 4F, the photoresist layers 406 and 410 are stripped. At this stage, an interconnection structure 454 (or redistribution structure 454) has been formed including the electrically conductive layer 460 and the electrical interconnects 164a and 164b. As shown in FIG. 4H, the interconnection structure 454 corresponding to multiple semiconductor devices 102, 102', and 102" can be manufactured in parallel on the carrier 400 and the electrically conductive layer 402. Prior to connection to any semiconductor device 102, the interconnection structure 454 can be tested. As a result, an interconnection structure (or redistribution structure) that has acceptable performance will be attached to a carrier 420 to which semiconductor devices 102 have been attached (such as illustrated in FIG. 4H). This is advantageous because the removal of defective interconnection structures can prevent or reduce loss of semiconductor devices 102 resulting from yield loss in manufacturing of the interconnection structures, such as yield loss due to incorrect patterning.

Next, as illustrated in FIG. 4G, a carrier 420 is provided, and multiple semiconductor devices are disposed adjacent to the carrier, including the semiconductor device 102 and adjacent semiconductor devices 102' and 102", thereby allowing certain of the manufacturing operations to be readily performed in parallel or sequentially. The active surfaces 104, 104' and 104" of the semiconductor devices 102, 102' and 102", respectively, may be attached to the carrier 420 using tape (not shown). The tape, which can be implemented as a single-sided or double-sided adhesive tape, secures components at an appropriate spacing with respect to one another, and allows subsequent manufacturing operations to be carried out with those components disposed adjacent to the carrier 420. The semiconductor devices 102, 102', and 102" are initially included within a wafer at a particular spacing with respect to one another, and the wafer is subjected to singulation to separate the semiconductor devices 102, 102', and 102". The semiconductor devices 102, 102', and 102", along with any additional semiconductor devices, can be arranged on the tape in an array manner, in which the multiple semiconductor devices are arranged in a two-dimensional fashion, or in a strip manner, in which the multiple semiconductor devices are arranged sequentially in a linear fashion. In the illustrated embodiment, the semiconductor devices 102, 102', and 102" are arranged so as to have a larger nearest-neighbor spacing with respect to one another, relative to their initial nearest-neighbor spacing within the wafer, thereby facilitating a fan-out configuration of resulting packages. However, it is contemplated that the spacing of the semiconductor devices 102, 102', and 102" can be varied for other implementations.

Next, as illustrated in FIG. 4H, the interconnection structure 454 is inverted and disposed on the carrier 420. For ease of presentation, the following manufacturing operations are primarily described with reference to the semiconductor device 102, the interconnection structure 454, and related components (shown within the dashed-line box in FIG. 4H), although the manufacturing operations can be similarly carried for other semiconductor devices and related components. Multiple electrical interconnects, including electrical interconnects 164a and 164b, may be positioned around the semiconductor device 102. The upper surfaces 176a and 176b of the electrical interconnects 164a and 164b may be disposed adjacent to the carrier 420, and may be substantially co-planar with the active surface 104 of the semiconductor device 102. A gap 422a may be formed between the lateral surface 108 of the semiconductor device 102 and the lateral surface 174a of the electrical interconnect 164a. Similarly, a gap 422b may be formed between the lateral surface 110 of the semiconductor device 102 and the lateral surface 174b of the electrical interconnect 164b. Also, a gap 424a may be formed between the upper surface 106 of the semiconductor device 102 and the first surface 462a of the electrical interconnect 461a. Similarly, a gap 424b may be formed between the upper surface 106 of the semiconductor device 102 and the first surface 462b of the electrical interconnect 461b.

Next, as illustrated in FIG. 4I, a molding material may be applied to form a molded structure 430. The molded structure 430 may substantially cover or encapsulate the top surface 106 and the lateral surfaces 108 and 110 of the semiconductor device 102. The molded structure may also substantially cover or encapsulate the lateral surfaces 174a and 174b of the electrical interconnects 164a and 164b, and the first surfaces 462a and 462b of the electrical interconnects 461a and 461b, respectively. The molded structure 430 may substantially fill the gaps 422a, 422b, 424a, and 424b. Because the semiconductor device 102 is disposed adjacent to the carrier 420, the active surface 104 of the semiconductor device 102 is substantially uncovered by the molded structure 430. The molding material that forms the molded structure 430 can include, for example, a Novolac-based resin, an epoxy-based resin, a silicone-based resin, or another suitable encapsulant. Suitable fillers also can be included, such as powdered $SiO_2$. The molded structure 430 can be formed using any of a number of molding techniques, such as injection molding. Once applied, the molding material is hardened or solidified, such as by lowering the temperature to below a melting point of the molding material, thereby forming the molded structure 430. To facilitate proper positioning of the molded structure 430 during subsequent singulation operations, fiducial marks can be formed in the molded structure 430, such as using laser marking.

Next, as illustrated in FIG. 4J, the carrier 400 is removed, exposing a surface 432 of the electrically conductive layer 402 that is opposite the upper surface 404 of the electrically conductive layer 402. The carrier 420 is also removed, exposing at least a surface 434 of the molded structure 430, the surfaces 176a and 176b of the electrical interconnects 164a and 164b, and the active surface 104 and the contact pads 112a and 112b of the semiconductor device 102.

Next, as illustrated in FIG. 4K, a redistribution structure 424 is next formed in situ adjacent to the surface 434 of the molded structure 430, the surfaces 176a and 176b of the electrical interconnects 164a and 164b, and the active surface 104 and the contact pads 112a and 112b of the semiconductor device 102. A dielectric material is applied using any of a number of coating techniques, such as printing, spinning, or spraying, and is then patterned to form a dielectric layer 470. As a result of patterning, the dielectric layer 470 is formed with openings, including the openings 140a and 140b that are aligned with the active surface 104 and sized so as to at least partially expose the contact pads 112a and 112b of the semiconductor device 102, and further including the openings 141a and 141b that are aligned and sized so as to at least partially expose electrical interconnects 164a and 164b. The dielectric layer 470 may be formed using the same types of materials as previously described for the dielectric layers 134 and 136. Patterning of the dielectric material to from the dielectric layer 470 can be carried out in any of a number of ways, such as photolithography, chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

An electrically conductive material is then applied to the dielectric layer 470 and drawn into the openings defined by the dielectric layer 470 using any of a number of coating techniques, such as chemical vapor deposition, electroless plating, electrolytic plating, printing, spinning, spraying, sputtering, or vacuum deposition, and is then patterned to form an electrically conductive layer 476. As a result of patterning, the electrically conductive layer 476 is formed with electrical interconnects that extend laterally along certain portions of the dielectric layer 470 and with gaps between the electrical interconnects that expose other portions of the dielectric layer 470. The electrically conductive layer 476 may be electrically connected to the electrically conductive layer 460 by electrical interconnects including electrical interconnects 164a and 164b. The electrically conductive layer 476 may be formed using the same types of materials as previously described for the electrical interconnects 146a and 146b. Patterning of the electrically conductive layer 476 can be carried out in any of a number of ways, such as photolithography, chemical etching, laser drilling, or mechanical drilling.

A dielectric material is then applied to the electrically conductive layer 476 and the exposed portions of the dielectric layer 470 using any of a number of coating techniques, such as printing, spinning, or spraying, and is then patterned to form a dielectric layer 474. As a result of patterning, the dielectric layer 474 is formed with openings that are aligned with the electrically conductive layer 476, including the openings 142a and 142b that are aligned so as to at least partially expose the electrically conductive layer 476 and are sized so as to accommodate solder bumps. The dielectric layer 474 may be formed using the same types of materials as previously described for the dielectric layers 134 and 136. Patterning of the dielectric material 474 can be carried out in any of a number of ways, such as photolithography, chemical etching, laser drilling, or mechanical drilling, and the resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured. Referring to FIG. 4K, the dielectric layer 474 along with the electrically conductive layer 476 and the dielectric layer 470 can be referred to as the redistribution structure 424. Similar to the interconnection structure 454, the redistribution structure 424 corresponding to multiple semiconductor devices, including the semiconductor device 102, can be manufactured in parallel.

Next, as illustrated in FIG. 4L, the electrically conductive layer 402 is removed, exposing the electrically conductive layer 460. Next, as illustrated in FIG. 4M, a protection layer 480 is formed adjacent to the electrically conductive layer 460. The protection layer 480 can be formed similarly to the protection layer 180, as described previously. While one protection layer 480 is illustrated in FIG. 4M, it is contemplated that more or less protection layers can be included for other implementations. The openings 182a and 182b in the protection layer 480 may expose portions of the electrically conductive layer 460, such as portions of surfaces 484a and 484b of the electrical interconnects 461a and 461b, respectively. The surfaces 484a and 484b are opposite the surfaces 462a and 462b, respectively. The protection layer 480 may be patterned to form the openings 182a and 182b, similarly to the patterning of the dielectric layers 470 and 474 described previously.

Singulation is next carried out along the dashed lines 490, as illustrated in FIG. 4N. In the illustrated embodiment, singulation may be carried out using a saw (not shown), which forms cutting slits 492. The alignment of the saw during singulation can be aided by fiducial marks, which allow proper positioning of the saw when forming the cutting slits 492. In particular, the cutting slits 492 extend completely through the molded structure 430, the redistribution structure 424, and the interconnection structure 454, thereby sub-dividing the molded structure 430, the redistribution structure 424, and the interconnection structure 454 into discrete units, including the package body 114, the redistribution unit 124, and the interconnection unit 154. After singulation, external connectors such as solder bumps may be electrically connected to the redistribution unit 124 and the interconnection unit 154, such as in the openings 142a, 142b, 182a, and 182b.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method of forming a semiconductor device package, comprising:
   providing a carrier;
   providing a semiconductor device including an active surface, a lateral surface, and an upper surface opposite the active surface;
   forming a first redistribution structure including a first electrical interconnect extending laterally within the first redistribution structure and a plurality of second electrical interconnects extending vertically from a first surface of the first electrical interconnect, each of the plurality of second electrical interconnects including a lower surface adjacent to the first surface, a lateral surface, and an upper surface opposite the lower surface;
   disposing the semiconductor device on the carrier such that the active surface is adjacent to the carrier;
   disposing the first redistribution structure on the carrier such that:
      the upper surface of each of the plurality of second electrical interconnects is adjacent to the carrier; and
      the plurality of second electrical interconnects are positioned around the semiconductor device; and
   forming a second redistribution structure adjacent to the active surface of the semiconductor device, the second redistribution structure including a third electrical interconnect extending laterally within the second redistribution structure.

2. The method of claim 1, further comprising applying a molding material to form a molded structure substantially covering the lateral surface and the upper surface of the semiconductor device, the lateral surface of each of the plurality of second electrical interconnects, and the first surface.

3. The method of claim 1, wherein forming the first redistribution structure includes:
   forming a first electrically conductive layer including an upper surface;
   applying a first photoresist material to the upper surface of the first electrically conductive layer to form a first photoresist layer adjacent to the upper surface of the first electrically conductive layer;
   patterning the first photoresist layer to define a first opening exposing the upper surface of the first electrically conductive layer; and
   applying a first electrically conductive material into the first opening to form the first electrical interconnect extending laterally within the first redistribution structure.

4. The method of claim 3, wherein forming the first redistribution structure further includes:
   applying a second photoresist material to the first surface of the first electrical interconnect to form a second photoresist layer adjacent to the first surface;
   patterning the second photoresist layer to define a plurality of second openings exposing the first surface;
   applying a second electrically conductive material into each of the plurality of second openings to form the plurality of second electrical interconnects extending vertically from the first surface; and
   stripping the second photoresist layer.

5. The method of claim 3, wherein forming the first electrically conductive layer includes:
   forming a first sub-layer of a second electrically conductive material, wherein the first sub-layer includes an upper surface; and
   applying a second sub-layer of a third electrically conductive material to the upper surface of the first sub-layer.

6. The method of claim 3, further comprising removing the first electrically conductive layer.

7. The method of claim 6, further comprising:
   forming a protection layer adjacent to a second surface of the first electrical interconnect, wherein the second surface is opposite the first surface of the first electrical interconnect; and
   patterning the protection layer to define an opening exposing the second surface.

8. The method of claim 7, wherein the opening is substantially aligned with the lower surface of at least one of the plurality of second electrical interconnects.

9. The method of claim 7, further comprising disposing an external connector in the opening.

10. The method of claim 1, wherein at least one of the plurality of second electrical interconnects electrically connects the third electrical interconnect and the first electrical interconnect.

11. A method of forming a semiconductor device package, comprising:
   providing a semiconductor device including an active surface, a lateral surface, and an upper surface opposite the active surface;

forming a first redistribution structure including a first electrical interconnect extending laterally within the first redistribution structure and a plurality of second electrical interconnects extending vertically from a first surface of the first electrical interconnect, each of the plurality of second electrical interconnects including a lower surface adjacent to the first surface, a lateral surface, and an upper surface opposite the lower surface;

disposing the semiconductor device and the first redistribution structure such that:

the active surface and the upper surface of each of the plurality of second electrical interconnects are substantially co-planar;

a first gap is formed between the first electrical interconnect and the upper surface of the semiconductor device; and a second gap is formed around the semiconductor device, the second gap separating the lateral surface of the semiconductor device and the lateral surface of each of the plurality of second electrical interconnects;

applying a molding material to form a molded structure substantially filling the first gap and the second gap, and substantially covering the first surface; and forming a second redistribution structure adjacent to the active surface of the semiconductor device, the second redistribution structure including a third electrical interconnect extending laterally within the second redistribution structure.

12. The method of claim 11, wherein forming the second redistribution structure includes:

applying a first dielectric material to the active surface of the semiconductor device to form a first dielectric layer adjacent to the active surface of the semiconductor device; and applying an electrically conductive material to the first dielectric layer to form an electrically conductive layer extending laterally within the second redistribution structure.

13. The method of claim 12, wherein forming the second redistribution structure further includes patterning the first dielectric material to define a first opening in the first dielectric layer, and wherein applying the electrically conductive material includes applying the electrically conductive material into the first opening to form the electrically conductive layer.

14. The method of claim 12, wherein forming the second redistribution structure further includes patterning the electrically conductive layer to form the third electrical interconnect.

15. The method of claim 14, wherein forming the second redistribution structure further comprises:

applying a second dielectric material to an upper surface of the third electrical interconnect to from a second dielectric layer adjacent to the upper surface of the third electrical interconnect; and patterning the second dielectric material to define a second opening in the second dielectric layer.

16. The method of claim 15, further comprising disposing an external connector in the second opening.

17. The method of claim 11, further comprising forming cutting slits extending through the molded structure, the first redistribution structure, and the second redistribution structure, the cutting slits being substantially aligned with the first redistribution structure and the second redistribution structure, such that:

the first redistribution structure is sub-divided to form a first redistribution unit;

the molded structure is sub-divided to form a package body; and the second redistribution structure is sub-divided to form a second redistribution unit.

18. The method of claim 17, further comprising electrically connecting the first redistribution structure of the semiconductor device package to another semiconductor device package.

19. The method of claim 11, wherein forming the first redistribution structure includes:

forming a first electrically conductive layer including an upper surface;

applying a first photoresist material to the upper surface of the first electrically conductive layer to form a first photoresist layer adjacent to the upper surface of the first electrically conductive layer;

patterning the first photoresist layer to define a first opening exposing the upper surface of the first electrically conductive layer; and applying a first electrically conductive material into the first opening to form the first electrical interconnect extending laterally within the first redistribution structure.

20. The method of claim 19, wherein forming the first redistribution structure further includes:

applying a second photoresist material to the first surface of the first electrical interconnect to form in a second photoresist layer adjacent to the first surface;

patterning the second photoresist layer to define a plurality of second openings exposing the first surface;

applying a second electrically conductive material into each of the plurality of second openings to form the plurality of second electrical interconnects extending vertically from the first surface; and stripping the second photoresist layer.

* * * * *